(12) United States Patent
Kang et al.

(10) Patent No.: US 6,654,274 B2
(45) Date of Patent: Nov. 25, 2003

(54) FERROELECTRIC MEMORY AND METHOD FOR DRIVING THE SAME

(75) Inventors: Hee Bok Kang, Daejeon-shi (KR); Hun Woo Kye, Kyonggi-do (KR); Duck Ju Kim, Cheju-do (KR); Je Hoon Park, Kyonggi-do (KR); Geun Il Lee, Kyonggi-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/167,397

(22) Filed: Jun. 13, 2002

(65) Prior Publication Data

US 2003/0002317 A1 Jan. 2, 2003

(30) Foreign Application Priority Data

Jun. 30, 2001 (KR) ..................................... P2001-38909

(51) Int. Cl.$^7$ .............................................. G11C 11/22
(52) U.S. Cl. ......................................... 365/145; 365/65
(58) Field of Search .......................... 365/145, 65, 149, 365/189.01, 189.11

(56) References Cited

U.S. PATENT DOCUMENTS

| 4,888,733 | A |  | 12/1989 | Mobley | 365/145 |
|---|---|---|---|---|---|
| 5,262,982 | A |  | 11/1993 | Brassington et al. | 365/145 |
| 5,598,366 | A |  | 1/1997 | Kraus et al. | 365/145 |
| 5,680,344 | A |  | 10/1997 | Seyyedy | 365/145 |
| 5,751,625 | A |  | 5/1998 | Mihara | 365/145 |
| 5,917,746 | A |  | 6/1999 | Seyyedy | 365/145 |
| 6,157,563 | A |  | 12/2000 | Hirano et al. | 365/145 |
| 6,240,007 | B1 | * | 5/2001 | Kang | 365/145 |
| 6,324,090 | B1 | * | 11/2001 | Kang | 365/143 |
| 6,356,476 | B1 | * | 3/2002 | Kang | 365/145 |

* cited by examiner

*Primary Examiner*—Anh Phung
(74) *Attorney, Agent, or Firm*—Morgan, Lewis & Bockius LLP

(57) ABSTRACT

A ferroelectric memory device includes a cell array block having a plurality of sub-cell array blocks regularly arranged in columns and rows, each sub-cell array block includes a plurality of unit cells, a plurality of main bitlines disposed along a first direction corresponding to the sub-cell array blocks in column units, a plurality of sub-bitlines disposed along the first direction in a one-to-one correspondence to the sub-cell array blocks, a plurality of pairs of sub-bitline pull down signal application lines and sub-bitline enable switch signal application lines disposed along a second direction perpendicular to the first direction, each pair corresponding to the sub-cell array block for applying a sub-bitline enable switch signal and a sub-bitline pull down signal, and a plurality of switching control blocks, each corresponding to the sub-cell array block for one of enabling the sub-bitlines selectively in response to the sub-bitline enable switch signal and pulling down the sub-bitlines in response to the sub-bitline pull down signal.

32 Claims, 12 Drawing Sheets

P: electric field
V: palarity

US 6,654,274 B2

FERROELECTRIC MEMORY AND METHOD FOR DRIVING THE SAME

The present invention claims the benefit of Korean Patent Application No. P2001-38909 filed in Korea on Jun. 30, 2001, which is hereby incorporated by reference.

BACKGROUND OF THE INVENTION

1. Field of the Invention

The present invention relates to a ferroelectric memory, and more particularly, to a ferroelectric memory which can write data on a cell independent from amplification operation of a sense amplifier without restricted by the operation of the sense amplifier; and a method for driving the same.

2. Background of the Related Art

The ferroelectric memory, i.e., a Ferroelectric Random Access Memory (FRAM), having in general a data processing speed similar to a Dynamic Random Access Memory (DRAM), and being capable of conserving data even if the power is turned off, is paid attention as a next generation memory. The FRAM, a memory having a structure similar to the DRAM, is provided with a capacitor of a ferroelectric material for utilizing a high residual polarization of the ferroelectric material. The residual polarization permits the conservation of a data even after removal of an electric field.

FIG. 1 illustrates a characteristic curve of a hysteresis loop of a general ferroelectric material.

Referring to FIG. 1, it can be known that a polarization induced by an electric field is, not erased totally, but, a certain amount('d' or 'a' state) of which is remained, even if the electric field is removed owing to existence of the residual polarization(or spontaneous polarization). The 'd' and 'a' states are corresponded to '1' and '0' respectively in application to a memory.

A related art non-volatile ferroelectric memory will be explained with reference to the attached drawings. FIG. 2 illustrates a unit cell of the related art non-volatile ferroelectric memory.

Referring to FIG. 2, the unit cell of the related art non-volatile ferroelectric memory is provided with a bitline B/L formed in one direction, a wordline W/L formed in perpendicular to the bitline, a plateline P/L formed spaced from the wordline in a direction identical to the wordline, a transistor T1 having a gate connected to the wordline and a drain connected to the bitline, and a ferroelectric capacitor FC1 having a first terminal connected to a source of the transistor T1 and a second terminal connected to the plateline P/L.

The data input/output operation of the related art ferroelectric memory will be explained. FIG. 3A illustrates a timing diagram of a write mode operation of the related art ferroelectric memory, and FIG. 3B illustrates a timing diagram of a read mode operation of the related art ferroelectric memory.

In writing, when an external chip enable signal CSBpad transits from 'high' to 'low' and, on the same time, an external write enable signal WEBpad transits from 'high' to 'low', the write mode is started. When address decoding is started in the write mode, a pulse applied to the wordline transits from 'low' to 'high' to select the cell. Thus, in a period the wordline is held 'high', the plateline has a 'high' signal applied thereto for one interval and a 'low' signal applied thereto for the other interval in succession. And, in order to write a logical value '1' or '0' on the selected cell, a 'high' or 'low' signal synchronized to the write enable signal WEBpad is applied to the bitline. That is, if a 'high' signal is applied to the bitline, and a signal applied to the plateline is 'low' in a period in which a signal applied to the wordline is in a 'high' state, a logical value '1' is written on the ferroelectric capacitor. If a 'low' signal is applied to the bitline, and a signal applied to the plateline is 'high', a logical value '0' is written on the ferroelectric capacitor.

Then, the operation for reading the data stored in the cell will be explained.

If the chip enable signal CSBpad is transited from 'high' to 'low' from outside of the cell, all bitlines are equalized to a 'low' voltage by an equalizer signal before the wordline is selected. Then, after the bitlines are disabled, an address is decoded, and the decoded address transits the wordline from 'low' to 'high', to select the cell. A 'high' signal is applied to the plateline of the selected cell, to break a data corresponding to a logical value '1' stored in the ferroelectric memory. If a logical value '0' is in storage in the ferroelectric memory, a data corresponding to the logical value '0' is not broken. The data not broken and the data broken thus provide values different from each other according to the aforementioned hysteresis loop, so that the sense amplifier senses a logical value '1' or '0'. That is, the case of the data broken is a case when the value is changed from 'd' to 'f' in the hysteresis loop in FIG. 1, and the case of the data not broken is a case when the value is changed from 'a' to 'f' in the hysteresis loop in FIG. 1. Therefore, if the sense amplifier is enabled after a certain time period is passed, in the case of the data broken, a logical value '1' is provided as amplified, and in the case of the data not broken, a logical value '0' is provided as amplified. After the sense amplifier amplifies data thus, since an original data should be restored, the plateline is disabled from 'high' to 'low' in a state a 'high' signal is applied to the wordline.

The following method may be used as one of methods for driving the related art ferroelectric memory.

A memory cell array is divided into a plurality of sub-cell arrays, and a selection switch signal SBSW is used. In a double pulse operation, a first pulse restores, or rewrites a cell data, a second pulse restores, or rewrites a logical "1", i.e., a high data, broken by the first pulse, or to be written newly. In the meantime, an SBPD signal is used for reinforcing a logical "0", i.e., a low data. That is, in the related art, after the operation of the sense amplifier is made by using the low data on the bitline, the low data is written again on the cell.

However, the aforementioned related art ferroelectric memory has the following problems.

The small design rule and cell size cause many difficulties in fabrication of the cell array and the peripherals, particularly, the use of poly related bitline which has a high resistance makes this problem more severe. High bitline resistance and bitline capacitance, when a ratio of Cb/CS (Cb: bitline capacitance, Cs: cell charge) is great, limits a cell size. In this case, a cell array efficiency is poor, resulting in a larger chip size. Moreover, in writing a low data, because the data is written again after the operation of the sense amplifier in which the low data on the bitline is used is finished, data writing can not be made during the operation of the sense amplifier, that increases a cell operation time period, and a cycle time period.

SUMMARY OF THE INVENTION

Accordingly, the present invention is directed to a ferroelectric memory and a method for driving the same that substantially obviates one or more of the problems due to limitations and disadvantages of the related art.

An object of the present invention is to provide a ferroelectric memory and a method for driving the same, which permits to write a data on a cell independent from an amplification operation of a sense amplifier without limited by the operation of the sense amplifier.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a ferroelectric memory device includes a cell array block having a plurality of sub-cell array blocks regularly arranged in columns and rows, each sub-cell array block includes a plurality of unit cells, a plurality of main bitlines disposed along a first direction corresponding to the sub-cell array blocks in column units, a plurality of sub-bitlines disposed along the first direction in a one-to-one correspondence to the sub-cell array blocks, a plurality of pairs of sub-bitline pull down signal application lines and sub-bitline enable switch signal application lines disposed along a second direction perpendicular to the first direction, each pair corresponding to the sub-cell array block for applying a sub-bitline enable switch signal and a sub-bitline pull down signal, and a plurality of switching control blocks, each corresponding to the sub-cell array block for one of enabling the sub-bitlines selectively in response to the sub-bitline enable switch signal and pulling down the sub-bitlines in response to the sub-bitline pull down signal.

In other aspect of the present invention, a ferroelectric memory device includes a cell array block having a plurality of sub-cell array blocks, each with a plurality of unit cells regularly arranged in a column direction, and a row direction, a plurality of main bitlines disposed in a first direction, a plurality of sub-bitlines disposed in the first direction, each corresponding to one of the sub-cell array blocks, a plurality of pairs of split wordlines within each of the sub-cell array blocks disposed along a second direction perpendicular to the first direction, a plurality of sub-bitline pull down application lines and sub-bitline enable switch application lines disposed along the second direction, each corresponding to the sub-cell array block, and a plurality of switching control blocks, each disposed corresponding to one of the sub-bitline pull down signal application lines and one of the sub-bitline enable switch signal application lines, and a space between adjacent sub-cell arrays, for switching a sub-bitline pull down signal, and a sub-bitline enable switch signal.

In another aspect of the present invention, a ferroelectric memory device includes a cell array block having sub-cell array blocks each with a plurality of unit cells arranged in a column direction, and a row direction regularly, a split wordline driver disposed at a center of the sub-cell array blocks divided in column units, a plurality of main bitlines running in one direction, a plurality of sub-bitlines each in correspondence to a sub-cell array block running in a direction the same with the main bitlines, a plurality of pairs of split wordlines in each of the sub-cell array blocks running in a direction perpendicular both to the main bitlines and sub-bitlines, a plurality of sub-bitline pull down signal application lines, and a plurality of sub-bitline enable switch application lines disposed along a direction the same with the split wordlines each in correspondence to the sub-cell array block, and a plurality of switching control blocks each disposed in correspondence to the sub-bitline pull down application line, and the sub-bitline enable switch application line, and a space between adjacent sub-cell arrays, for switching a sub-bitline pull down signal and a sub-bitline enable switch signal.

In another aspect of the present invention, a ferroelectric memory device includes a cell array block having sub-cell array blocks each with a plurality of unit cells arranged in a column direction, and a row direction regularly, a plurality of main bitlines disposed along one direction, a plurality of sub-bitlines each in correspondence to a sub-cell array block running in a direction the same with the main bitlines, a plurality of pairs of wordlines/platelines in each of the sub-cell array blocks running in a direction perpendicular both to the main bitlines and the sub-bitlines, a plurality of sub-bitline pull down signal application lines, and sub-bitline enable switch signal application lines running in a direction the same with pairs of the wordlines/platelines each disposed in correspondence to the sub-cell array block, and a plurality of switching control blocks each disposed in correspondence to the sub-bitline pull down signal application lines, and the sub-bitline enable switch signal application line, and a space between adjacent sub-cell arrays, for switching a sub-bitline pull down signal and a sub-bitline enable switch signal.

In another aspect of the present invention, a method for driving a ferroelectric memory of a split wordline structure for enabling, and pulling down a sub-bitline selected in response to a sub-bitline enable signal and a sub-bitline pull down signal, includes (a) enabling a first split wordline application signal to high in 'B', 'C', 'D', and 'E' periods, and a second split wordline application signal to high in 'B', 'C', 'D', and 'F' periods, within a continuous enable cycle divided into 'A', 'B', 'C', 'D', 'E', and 'F' periods, (b) enabling a sub-bitline enable switch signal to high in 'B' period at first for applying a cell data value to a bitline through a sub-bitline, disabling the sub-bitline enable switch signal to low in 'C', and 'D' periods for cutting off signal flows on the sub-bitline and the bitline, and enabling the sub-bitline enable switch signal to high again in 'E', and 'F' periods for the second time for restoring, or re-writing a logical '1', i.e., a high data, broken in 'B' period, or to be written newly, and (c) writing a logical '0', i.e., a low data, by using the sub-bitline pull down signal which is enabled to high only in 'C', and 'D' periods, regardless of operation of a sense amplifier.

In another aspect of the present invention, A method for driving a ferroelectric memory of a split wordline structure for enabling, and pulling down a sub-bitline selected in response to a sub-bitline enable signal and a sub-bitline pull down signal includes (a) enabling a wordline application signal to high in 'B', 'C', 'D', and 'E' periods, and a plateline application signal to high in 'B', 'C', and 'D' periods, within a continuous enable cycle divided into 'A', 'B', 'C', 'D', 'E', and 'F' periods, (b) enabling a sub-bitline enable switch signal to high in 'B' period at first for applying a cell data value to a bitline through a sub-bitline, disabling the sub-bitline enable switch signal to low in 'C', and 'D' periods for cutting off signal flows on the sub-bitline, and the bitline, and enabling the sub-bitline enable switch signal to high again in 'E', and 'F' periods for the second time for restoring, or re-writing a logical '1', i.e., a high data, broken in 'B' period, or to be written newly, and (c) writing a logical '0', i.e., a low data, by using the sub-bitline pull down signal which is enabled to high only in 'C', and 'D' periods, regardless of operation of a sense amplifier.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

Figure 4:
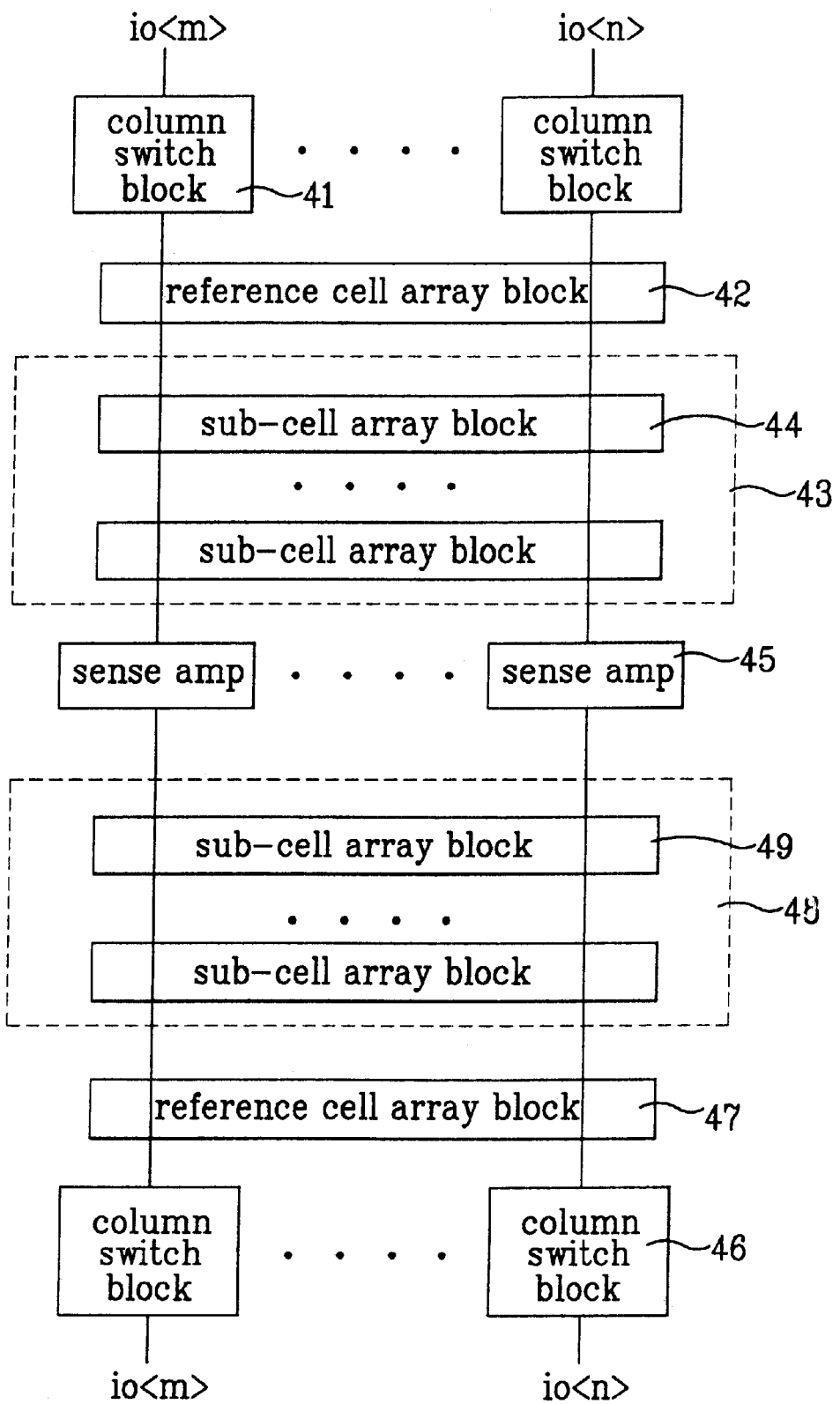
FIG. 4 illustrates an exemplary system of a ferroelectric split cell array in accordance with the present invention.
Figure 5:
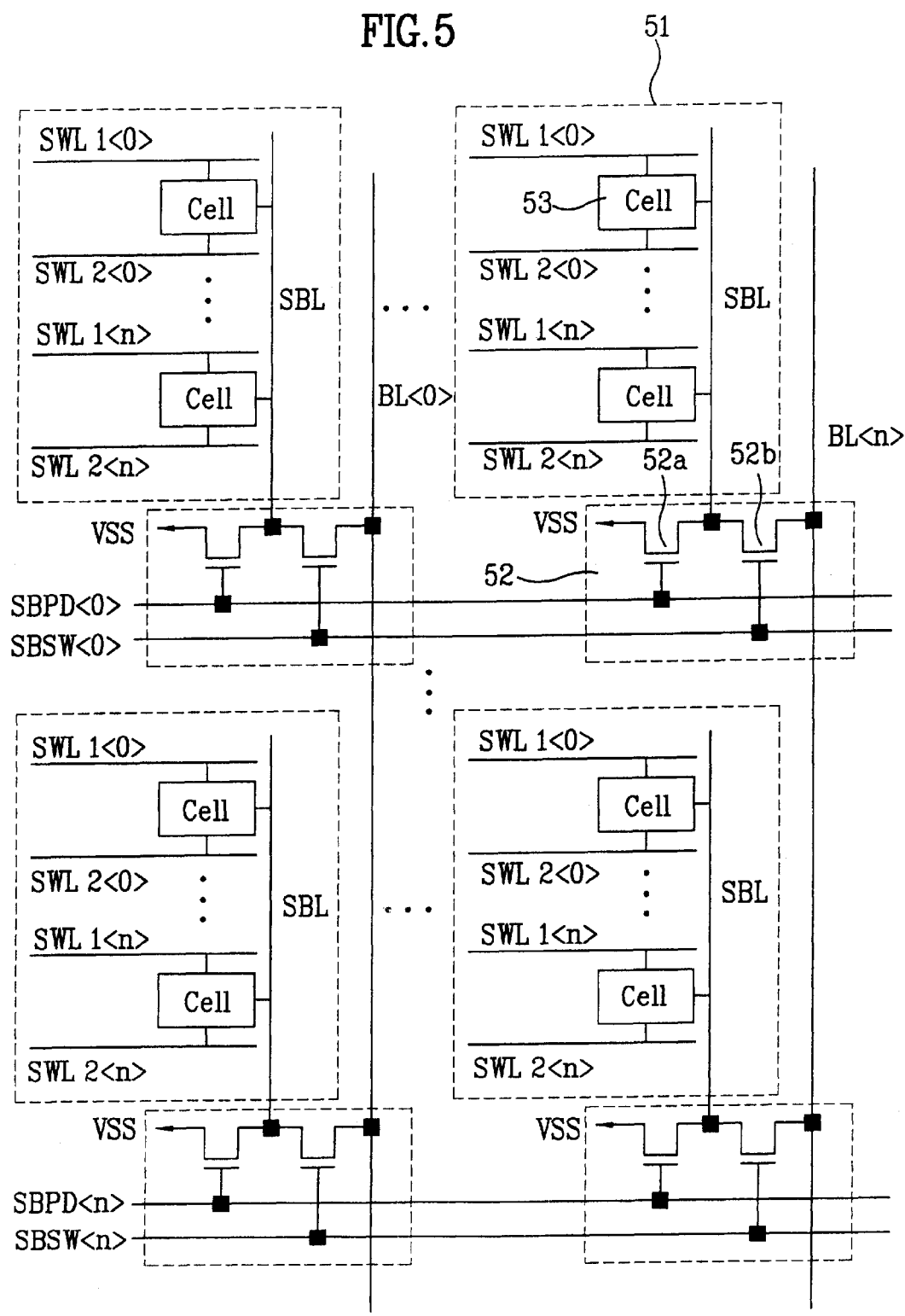
FIG. 5 illustrates a detailed exemplary system of a ferroelectric split cell array in accordance with the present invention.

FIG. 4 illustrates an exemplary system of a ferroelectric split cell array in accordance with a first preferred embodiment of the present invention, and FIG. 5 illustrates a detailed exemplary system of a ferroelectric split cell array in accordance with a first preferred embodiment of the present invention. The present invention provides a core circuit system, and an operation method, for suppressing a chip size increase, securing a stable Cb/Cs ratio, and improving a chip operation speed. The present invention also facilitates a significant reduction of a load on driving a cell capacitor by using an SWL cell, for doubling a number of column arrays. According to this, the present invention reduces an area occupied by the cell driver, and resolves an inconsistency of loading occurred at the wordlines and the platelines.

An entire system of blocks around the cell array of the present invention will be explained.

Referring to FIG. 4, there are a top array block 43, and a bottom array block 48 in the cell array, and a sense amplifier 45 is connected to each of bitlines in the middle of the top, and bottom cell array blocks 43, and 48. There is a column switch block 41, or 46 at each end of the bitline connected to a data bus io<m>, - - - , io<n>. The data buses io<m>, - - - , io<n> for the top cell array block 43 or the bottom cell array block are connected to a main amplifier (not shown) at one end of the entire cell array block. The top, or bottom cell array block 43, or 48 has a plurality of sub-cell array blocks 44 or 49. There is a reference cell array block 42, or 47 in correspondence to the top or bottom cell array block 43, or 48. The reference cell array block 42 is provided between the top cell array block 43 and a column switch block 41 in correspondence to the top cell array block 43, and the reference cell array block 47 is provided between the bottom cell array block 48 and a column switch block 46 in correspondence to the bottom cell array block 48.

A detailed system of the top, or bottom cell array block having the plurality of sub-cell array blocks will be explained.

Referring to FIG. 5, the cell array block includes a plurality of main bitlines BL<0>, - - - , BL<n> running in one direction, a plurality of sub-bitlines SBL each in correspondence to a sub-cell array 51 running in a direction the same with the main bitlines BL<0>, - - - , BL<n>, a plurality of pairs of split wordlines (SWL1<0>, SWL2<0>), - - - , (SWL1<n>, SWL2<n>) in each of the sub-cell array 51 running in a direction perpendicular both to the main bitlines BL<0>, - - - , BL<n>, and sub-bitlines SBL, SBPD application lines, and SBSW application lines (SBPD<0>, SBSW<0>), - - - , (SBPD<n>, SBSW<n>), running in a direction the same with the split wordlines each in correspondence to the sub-cell array 51, and a plurality of switching control blocks 52 each in correspondence to the SBPD application line, and the SBSW application line (SBPD<0>, SBSW<0>), - - - , (SBPD<n>, SBSW<n>), and each of the sub-cell arrays 51, for switching an SBPD signal, an SBSW signal.

Each of the switching control blocks 52 includes a first, and a second switching transistors 52a, and 52b connected in series, wherein the first switching transistor 52a has a gate connected to the SBPD application line, and one side electrode connected to a VSS terminal, the second switching transistor 52b has a gate connected to the SBSW application line, one side electrode connected to a main bitline, and an output terminal the first and second switching transistors 52a, and 52b connected in common thereto is connected to the sub bitline.

Each of the main bitlines BL<0>, - - - , BL<n> selectively is connected to one of the plurality of sub-bitlines SBL in one time of operation. That is, only one of sub-bitline enable switch signals SBSW is enabled for selecting one of the plurality of the sub-bitlines, that permits to reduce a load on the bitline to a level of one sub-bitline load. When a sub-bitline pull down signal SBPD signal is enabled, a level of the sub-bitline is pulled down to Vss.

Figure 6:
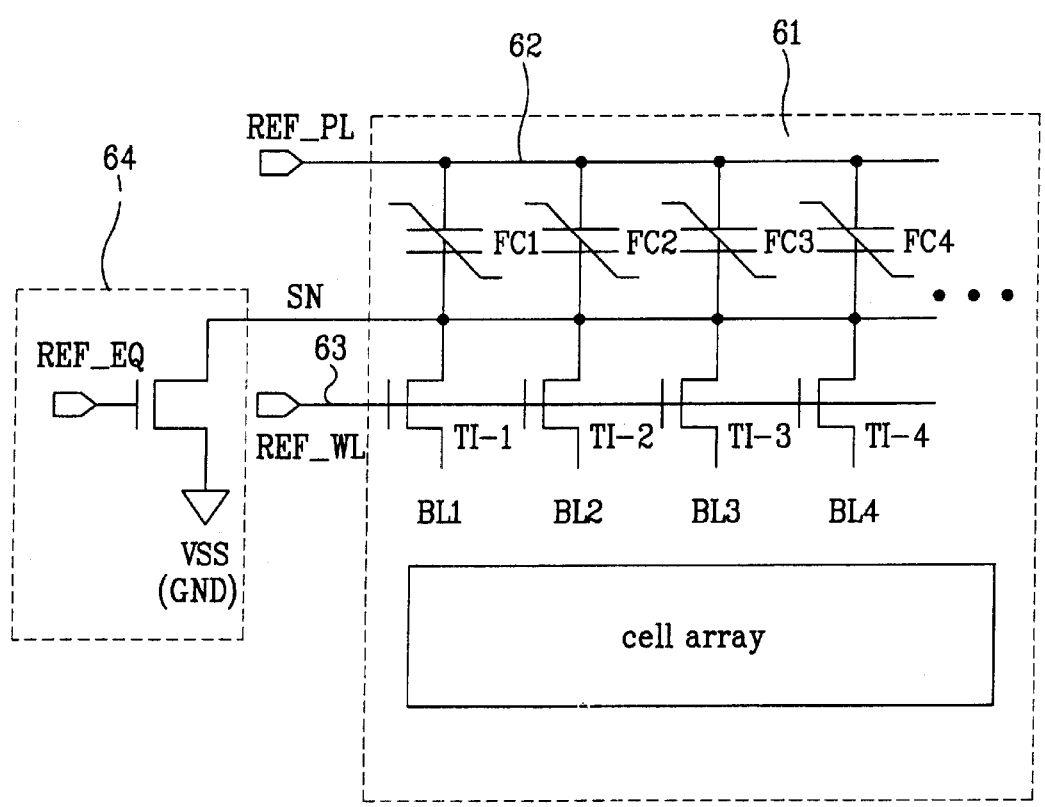
FIG. 6 illustrates an exemplary system of a reference cell array block according to the present invention.
Figure 7:
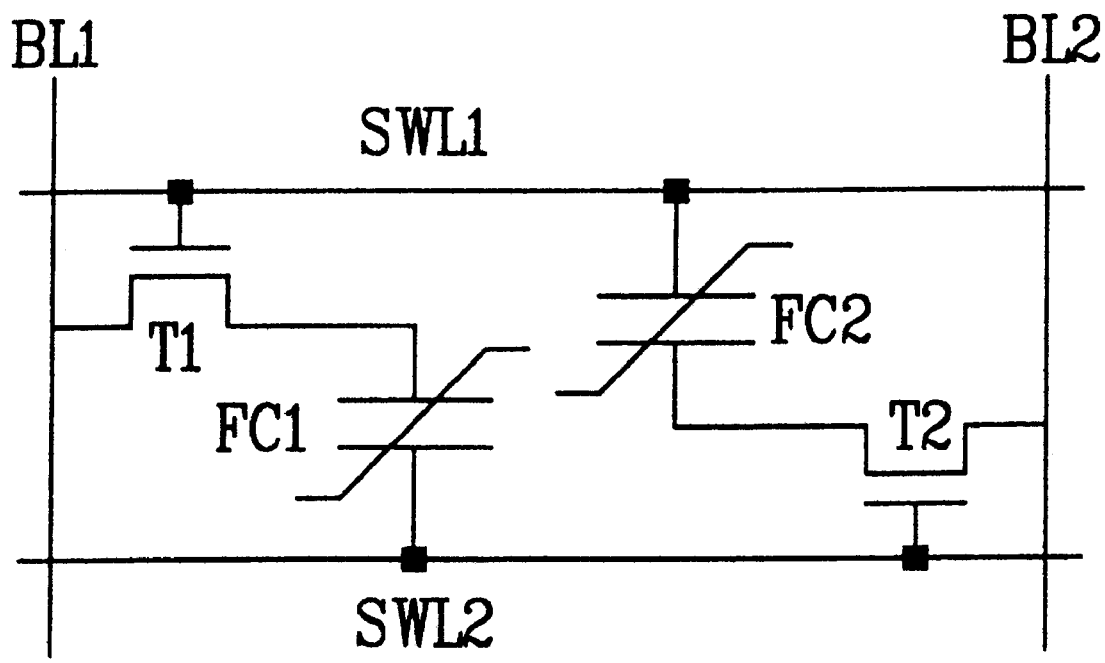
FIG. 7 illustrates an exemplary system of an SWL cell in accordance with the present invention.

Systems of a reference cell array block, and a unit cell thereof of the ferroelectric split cell array of the present invention will be explained. FIG. 6 illustrates a system of a reference cell array block of the present invention, and FIG. 7 illustrates a system of an SWL cell in accordance with a first preferred embodiment of the present invention.

The reference cell array block includes a plurality of bitlines BL1, BL2, BL3, - - - , BLn running in one direction within a unit cell block 61, one reference wordline REF_W/L 63 running perpendicular to the bitlines, a reference plateline REF_P/L 62 running in parallel to the reference wordline REF_W/L, a plurality of reference capacitors FC1, FC2, FC3, - - -, FCn connected in parallel each having a first electrode connected to the reference plateline REF_P/L, and a second electrode connected to a storage node SN of the reference cell, a level initializing part 64 of an NMOS transistor T2 having a gate with a reference cell equalizing control signal REF_EQ applied thereto, and one side electrode connected to a ground terminal GND, and the other side electrode connected to the storage node SN, and a switching block having a plurality of NMOS transistors T1-1, T1-2, T1-3, - - -, and T1-n, each having one side electrode connected to the bitline, the other side electrode connected to the storage node SN of the reference capacitor, and a gate connected to the reference wordline REF_W/L in common.

The unit cell of the ferroelectric split cell array in accordance with a first preferred embodiment of the present invention will be explained.

The unit cell includes a first split wordline SWL1 and a second split wordline SWL2 running in a row direction spaced a fixed distance, a first bitline BL1 and a second bitline BL2 running in a direction perpendicular to the first, and second split wordlines SWL1, and SWL2, a first transistor T1 having a gate connected to the first split wordline SWL1, and a drain connected to the first bitline BL1, a first ferroelectric capacitor FC1 connected between a source of the first transistor T1, and the second split wordline SWL2, a second transistor T2 having a gate connected to the second split wordline SWL2, and a drain connected to the second bitline BL2, and a second ferroelectric capacitor FC2 connected between a source of the second transistor T2 and the first split wordline SWL1.

Figure 8:
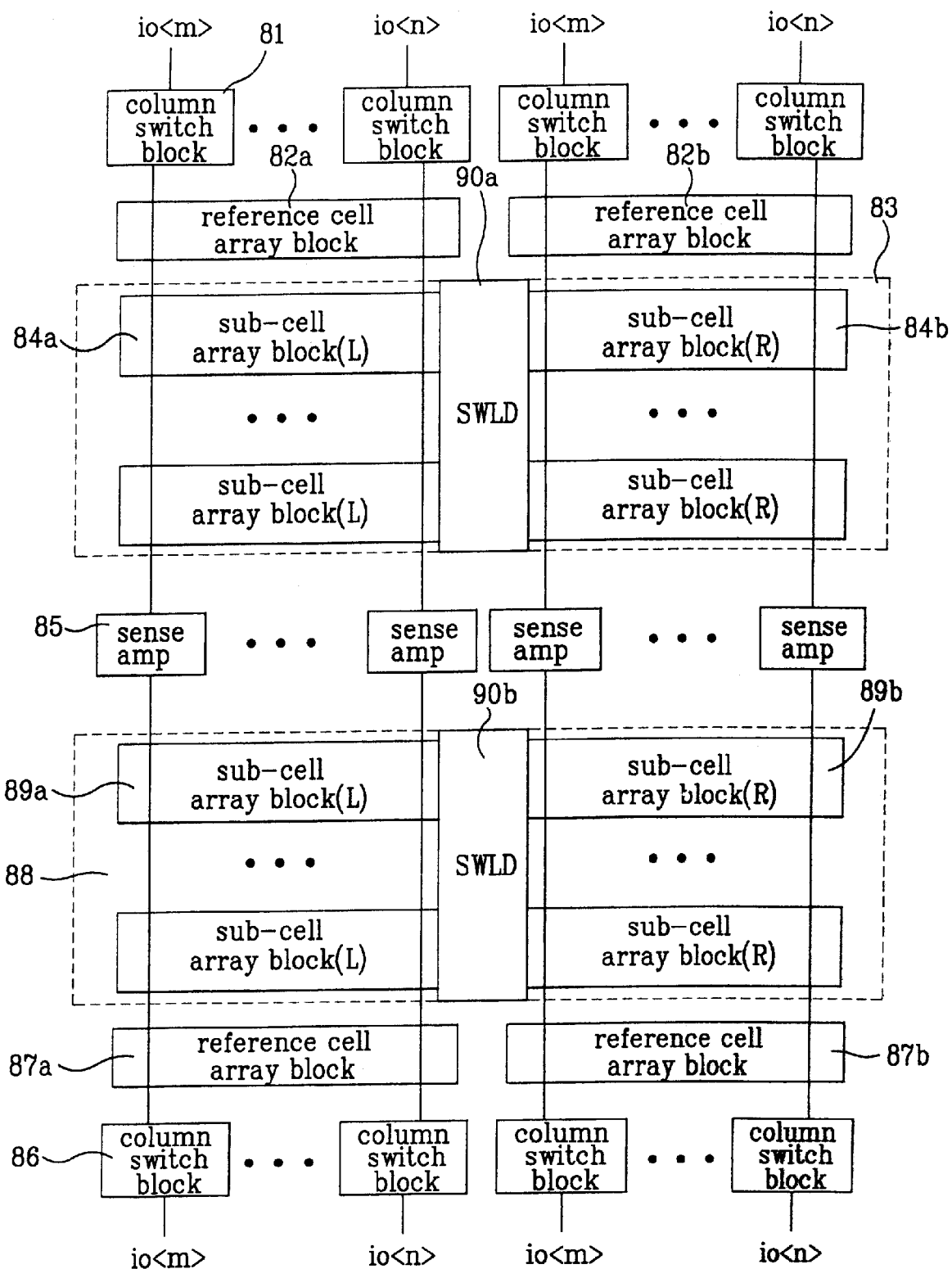
FIG. 8 illustrates another exemplary system of a ferroelectric split cell array in accordance with the present invention.
Figure 9:
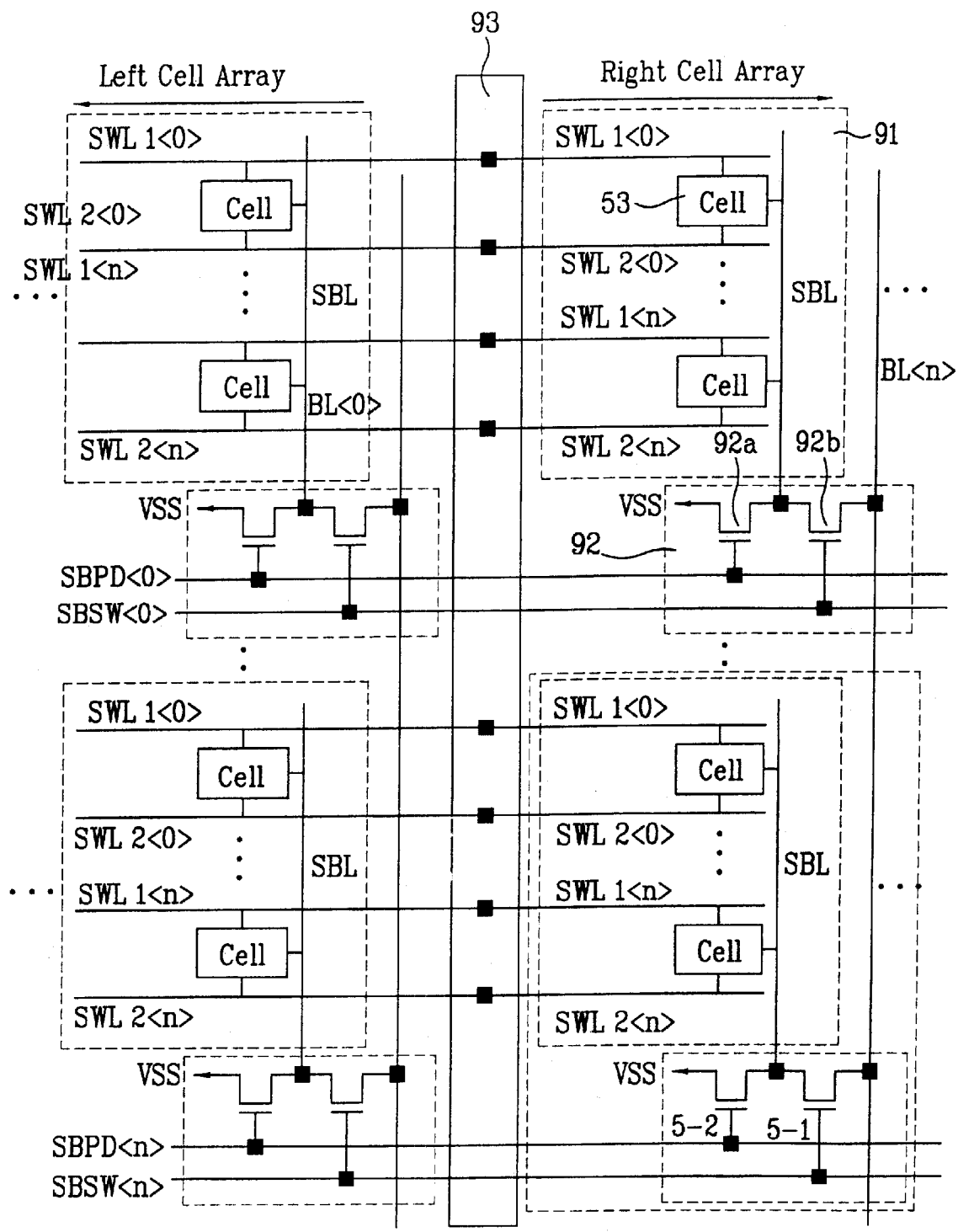
FIG. 9 illustrates another detailed exemplary system of a ferroelectric split cell array in accordance with the present invention.

A ferroelectric split cell array in accordance with a second preferred embodiment of the present invention will be explained. FIG. 8 illustrates a system of a ferroelectric split cell array in accordance with a second preferred embodiment of the present invention, and FIG. 9 illustrates a detailed system of a ferroelectric split cell array in accordance with a second preferred embodiment of the present invention.

Referring to FIG. 8, the ferroelectric split cell array in accordance with a second preferred embodiment of the present invention, having sub-cell array blocks each divided into two, and a split wordline driver (SWLD) at a central part thereof, includes a top cell array block 83, a bottom cell array block 88, and a plurality of sense amplifier 85 each connected to the bitline in the middle of the top, and bottom cell array blocks 83, and 88. There is a column switch block 81, or 86 connected to the data bus io<m>, - - -, io<n> at each end of the bitline.

The data buses io<m>, - - -, io<n> for the top cell array block 83, and the bottom cell array block 88 are connected to the main amplifier (not shown) at one end of entire cell array block.

Each of the top, and bottom cell array blocks 83, and 88 includes a plurality of sub-cell array blocks, wherein the top cell array block 83 includes the split wordline driver (SWLD) 90a at a center, and the plurality of the sub-cell array blocks L 84a, and the sub-cell array blocks R 84b at left and right of the split wordline driver 90a, and the bottom cell array block 88 includes the split wordline driver (SWLD) 90b at a center, and the plurality of the sub-cell array blocks L 89a, and the sub-cell array blocks R 89b at left and right of the split wordline driver 90b.

There are reference cell array blocks 82a, and 82b in correspondence to the sub-cell array blocks L 84a, and the sub-cell array blocks R 84b respectively, and reference cell array blocks 87a, and 87b in correspondence to the sub-cell array blocks L 89a, and the sub-cell array blocks R 89b respectively. The reference cell array blocks 82a, and 82b are provided between the top cell array block 83, and the column switch blocks 81 corresponding to the top cell array blocks 83, and the reference cell array blocks 87a, and 87b are provided between the bottom cell array block 88, and the column switch blocks 86 corresponding to the bottom cell array block 88. A detailed system of the reference cell array blocks is identical to the system explained in detail in association with FIG. 6.

A detailed system of the cell array block having the plurality of sub-cell array block L, and R will be explained.

Referring to FIG. 9, the cell array block includes a plurality of main bitlines tBL<0>, - - -, BL<n> running in one direction, sub-bitlines SBL formed in correspondence to the sub-cell arrays 91 running in a direction the same with the main bitline BL<0>, - - -, BL<n>, pairs of split wordlines (SWL1<0>, SWL2<0>), - - -, (SWL1<n>, SWL2<n>) each formed in the sub-cell array 91 running in a direction perpendicular both to the main bitlines BL<0>, - - -, BL<n>, and the sub-bitlines, SBPD application lines, and SBSW application lines (SBPD<0>, SBSW<0>), - - -, (SBPD<n>, SBSW<n>) formed in correspondence to the sub-cell arrays 91 running in a direction the same with the split wordlines, and a plurality of switching control blocks 92 formed in correspondence to, and between the SBPD application lines, and SBSW application lines (SBPD<0>, SBSW<0>), - - -, (SBPD<n>, SBSW<n>), and the sub-cell arrays 91, for switching the SBPD signal, and the SBSW signal.

Each of the switching control blocks 92 includes first, and second switching transistors 92a, and 92b connected in series, wherein the first switching transistor 92a has a gate connected to the SBPD application line, and one side electrode connected to a VSS terminal, and the second switching transistor 92b has a gate connected to the SBSW application line, and one side electrode connected to the main bitline. There is one output terminal connected to the sub-bitline, to which the first, and second transistors 92a, and 92b are connected in common.

Each of the main bitlines BL<0>, - - -, BL<n> selectively is connected to one of the plurality of sub-bitlines SBL in one time of operation. That is, only one of sub-bitline enable switch signals SBSW is enabled for selecting one of the plurality of the sub-bitlines, that permits to reduce a load on the bitline to a level of one sub-bitline load. There is the split wordline driver 93 running between the sub-cell arrays 91.

Figure 10:
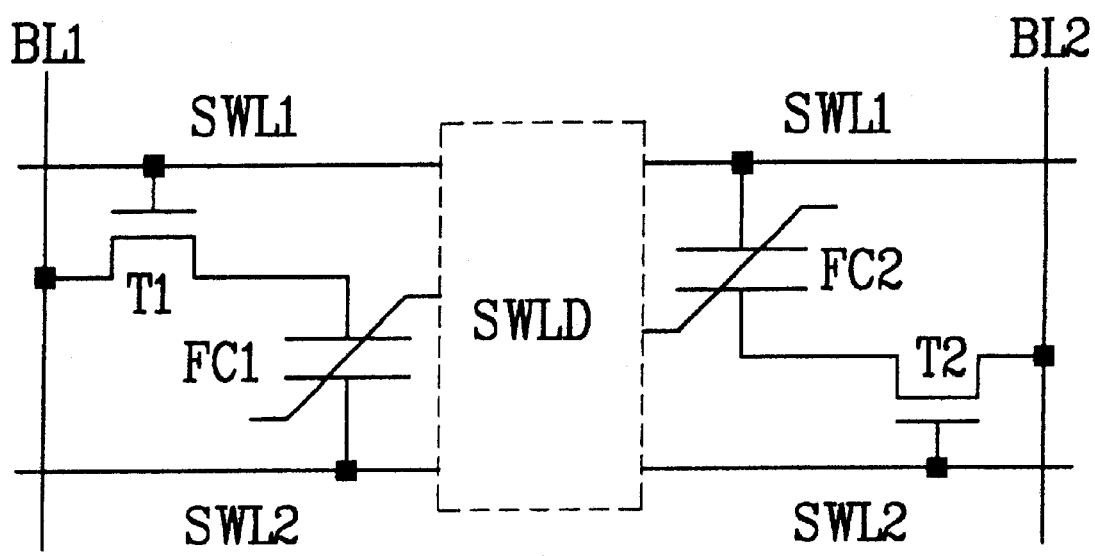
FIG. 10 illustrates another exemplary system of an SWL cell in accordance with the present invention.

Unit cell of the ferroelectric split cell array in accordance with a second preferred embodiment of the present invention will be explained. FIG. 10 illustrates a system of an SWL cell in accordance with a second preferred embodiment of the present invention.

The unit cell includes a first split wordline SWL1 and a second split wordline SWL2 running in a row direction spaced a fixed distance, a first bitline BL1 and a second bitline BL2 running in a direction perpendicular to the first, and second split wordlines SWL1, and SWL2, a first transistor T1 on a left side of the split wordline driver having a gate connected to the first split wordline SWL1, and a drain connected to the first bitline BL1, a first ferroelectric capacitor FC1 connected between a source of the first transistor T1, and the second split wordline SWL2, a second transistor T2 on a right side of the split wordline driver having a gate connected to the second split wordline SWL2, and a drain connected to the second bitline BL2, and a second ferroelectric capacitor FC2 connected between a source of the second transistor T2 and the first split wordline SWL1.

Figure 11:
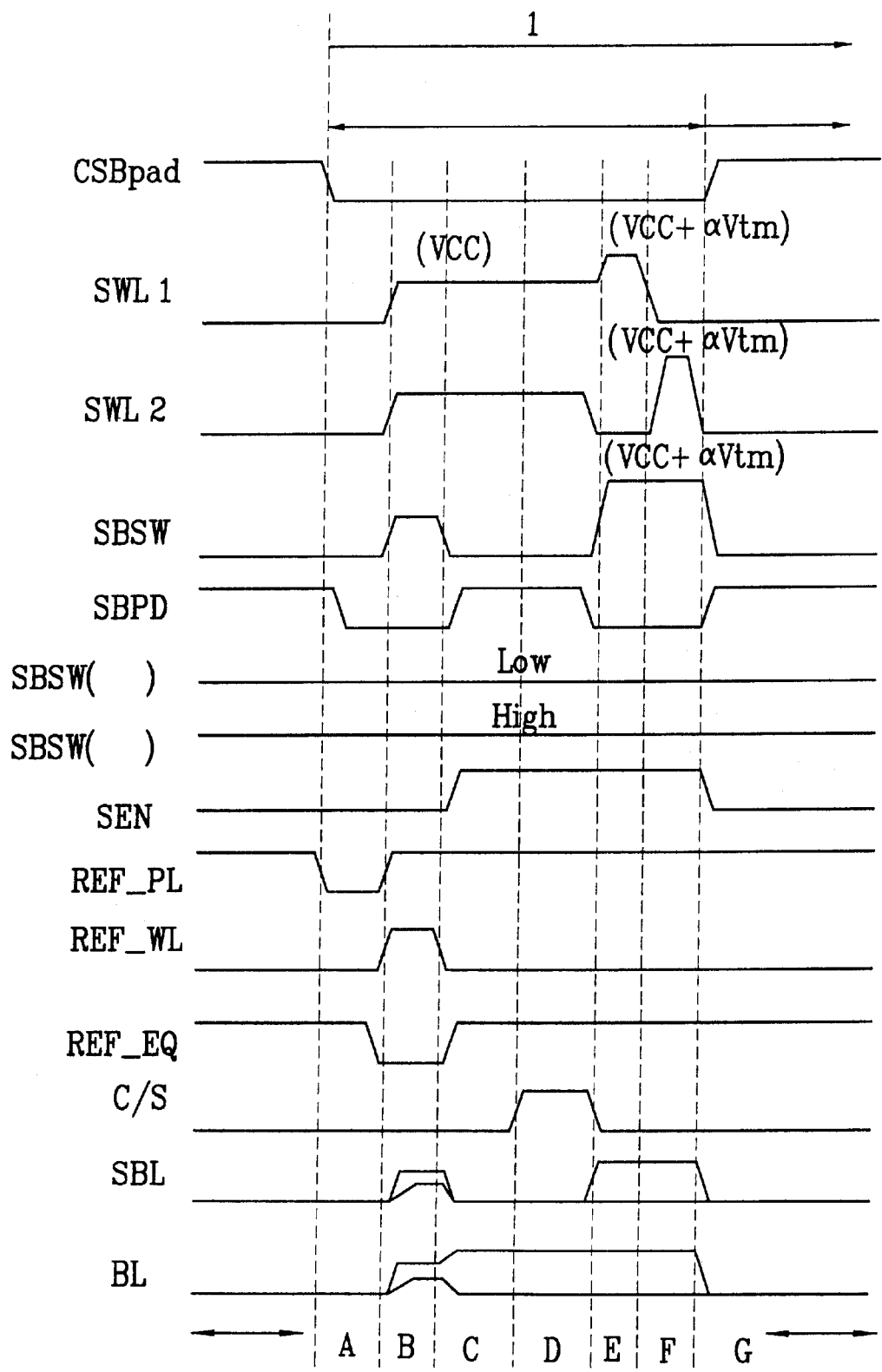
FIG. 11 illustrates an exemplary operational timing diagram of the ferroelectric split cell array in accordance with the present invention.

The operation of the ferroelectric split cell array in accordance with the first, or second preferred embodiment of the present invention will be explained. FIG. 11 illustrates an operation timing diagram of the ferroelectric split cell array in accordance with the first, or second preferred embodiment of the present invention. The timing operation of reference occurrence will be explained, at first.

During a prior cycle, a REF_EQ is at high, to leave the reference capacitor in a discharged state. In an 'A' period, for charging the reference capacitor, the REF_PL has a low pulse waveform, and the REF_EQ is still at high. In a 'B' period, for providing a reference level to the bitline BL, the charge stored in the reference ferroelectric capacitor in the 'A' period is discharged, again. To do this, the REF_EQ is disabled to a low pulse, the REF_WL is enabled to a high pulse, and the REF_PL is transited to high. According to this, the reference level is occurred at the bitline BL. The REF_EQ is transited to high again from the 'C' period and thereafter, for resetting the reference level to low again.

The operation of the SWL cell array will be explained.

During the prior cycle, which is a period for pre-charging the bitline, the bitline BL, and the sub-bitline are in a state separated from each other as the sub-bitline enable switch signal SBSW is disabled to low, and the sub-bitline SBL is pre-charged to low as the sub-bitline pull down signal SBPD transits to high. The bitline BL is pre-charged to low, separately. In the 'A' period, the sub-bitline pull down signal SBPD is disabled to low, when an address is decoded. The first split wordline application signal SWL1 is enabled to high in 'B', 'C', 'D', and 'E' periods, and, particularly, generates a voltage of (Vcc+aVtn) higher than external supply voltage in the 'E' period, where 'a' is a value greater than 1.5. The second split wordline application signal SWL2 is enabled to high in 'B', 'C', 'D', and 'F' periods, disabled to low in rest of the periods, and generates a voltage (Vcc+aVtn) higher than the external supply voltage Vcc in an 'F' period. Therefore, the first split wordline application signal SWL1 has a single pulse waveform, and the second split wordline application signal SWL2 has a double pulse waveform. The sub-bitline enable switch signal SBSW also has a double pulse waveform. In the 'B' period, the first high pulse is generated, for application of a cell data value to the bitline BL through the sub-bitline SBL, and disabled to low in 'C', and 'D' periods, to cut off a signal flow in the sub-bitline SBL, and in the bitline BL. Then, the SBSW signal is enabled to high in 'E', and 'F' periods again, to generate the second pulse (Vcc+aVtn) higher than Vcc, where 'a' has a value greater than 1.5. In the sub-bitline enable switch signal SBSW, the first pulse is an operation for loading the cell data on the bitline, and the second pulse is a step for restoring, or re-writing a logical '1', i.e., a high data, broken at the first pulse, or to be written, newly. In 'E' period, a high data is restored, or re-written at the first ferroelectric capacitor FC1, and, in 'F' period, a high data is restored, or re-written at the second ferroelectric capacitor FC2.

In order to re-write a logical '0', i.e., a low data, the sub-bitline pull down signal SBPD is used for re-writing a low data. That is, the data is written again not after operation of the sense amplifier is finished by using the low data on the bitline, but a low data is written on the cell by using the sub-bitline pull down signal SBPD. Therefore, in the data writing of the present invention, since writing of the low data can be made independent from the operation of the sense amplifier, the data writing can be made even if the sense amplifier is in operation, that can reduce a cell operation time period, and a cycle time period by eliminating a time period required for reinforcing the low data after data amplification by the sense amplifier. In more detail, the low data is reinforced by the sub-bitline pull down signal SBPD, and only the high data is written by the bitline BL, again. In this instance, in a non-selected sub-cell array block, the sub-bitline enable switch signal SBSW is disabled to low, and the sub-bitline pull down signal SBPD is at high to keep the sub-bitline at low. In the meantime, a sense amplifier enable signal SEN is enabled to high in 'C', 'D', 'E', and 'F' periods, for amplifying a bitline sensing data. The high data amplified thus is restored in 'E', and 'F' periods, again. If a column selection signal C/S is enabled to high in 'D' period at a time point the amplification is finished, the amplified bitline data is loaded on a data bus outside of the cell array. On the other hand, in a write mode, since a data on an external data bus forcibly changes the data on the bitline, a new high data is written in 'E', and 'F' periods.

Figure 12:
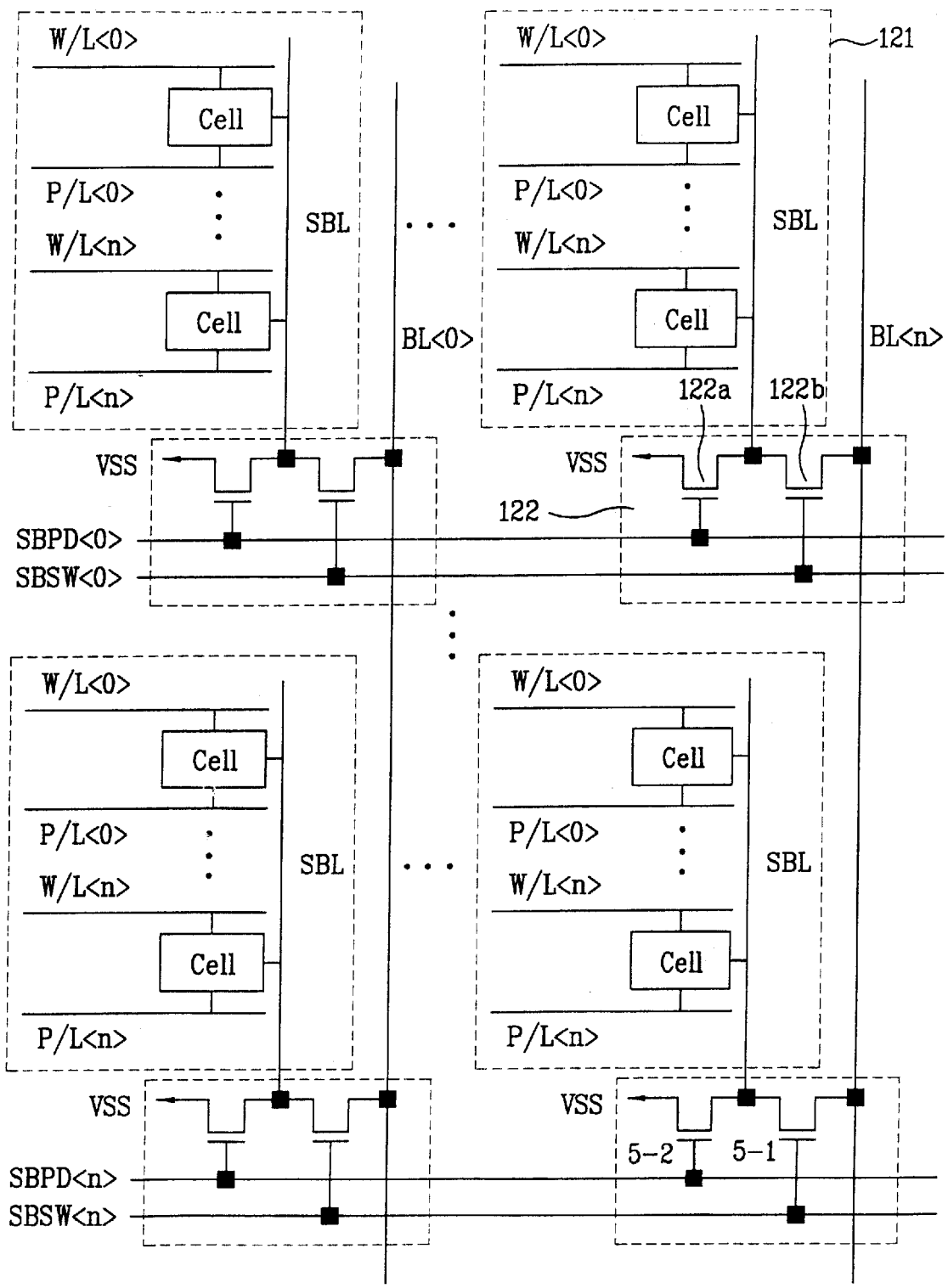
FIG. 12 illustrates another exemplary detailed system of a ferroelectric cell array in accordance with the present invention; and, FIG. 13 illustrates another exemplary operation timing diagram of the ferroelectric cell array in accordance with the present invention.

A system, and a method for operating a ferroelectric cell array in accordance with a third preferred embodiment of the present invention will be explained. FIG. 12 illustrates a detailed system of a ferroelectric cell array in accordance with a third preferred embodiment of the present invention. A basic cell array system of a ferroelectric cell array in accordance with a third preferred embodiment of the present invention is as shown in FIG. 4, and a reference cell array block of a ferroelectric cell array in accordance with a third preferred embodiment of the present invention is as shown in FIG. 6, except that, not the split wordline SWL, but a unit cell using a cell plate line P/L, is employed.

The ferroelectric cell array in accordance with a third preferred embodiment of the present invention includes a plurality of main bitlines BL<0>, - - - , BL<n> running in one direction, a plurality of sub-bitlines SBL each in correspondence to a sub-cell array 121 running in a direction the same with the main bitlines BL<0>, - - - , BL<n>, a plurality of pairs of wordlines/platelines (W/L<0>, P/L2<0>), - - - , (W/L<n>, P/L<n>) in each of the sub-cell array 121 running in a direction perpendicular both to the main bitlines BL<0>, - - - , BL<n>, and sub-bitlines SBL, SBPD application lines, and SBSW application lines (SBPD<0>, SBSW<0>), - - - , (SBPD<n>, SBSW<n>), running in a direction the same with the pairs of wordlines/platelines (W/L<0>, P/L2<0>), - - - , (W/L<n>, P/L<n>) each in correspondence to the sub-cell array 121, and a plurality of switching control blocks 122 each in correspondence to the SBPD application line, and the SBSW application line (SBPD<0>, SBSW<0>), - - - , (SBPD<n>, SBSW<n>), and each of the sub-cell arrays 121, for switching an SBPD signal, an SBSW signal.

Each of the switching control blocks 122 includes a first, and a second switching transistors 122a, and 122b connected in series, wherein the first switching transistor 122a has a gate connected to the SBPD application line, and one side electrode connected to a VSS terminal, the second switching transistor 122b has a gate connected to the SBSW application line, one side electrode connected to a main bitline, and an output terminal the first and second switching transistors 122a, and 122b connected in common thereto is connected to the sub bitline.

Each of the main bitlines BL<0>, - - - , BL<n> selectively is connected to one of the plurality of sub-bitlines SBL in one time of operation. That is, only one of sub-bitline enable switch signals SBSW is enabled for selecting one of the plurality of the sub-bitlines, that permits to reduce a load on the bitline to a level of one sub-bitline load. When a sub-bitline pull down signal SBPD signal is enabled, a level of the sub-bitline is pulled down to Vss.

Figure 1:
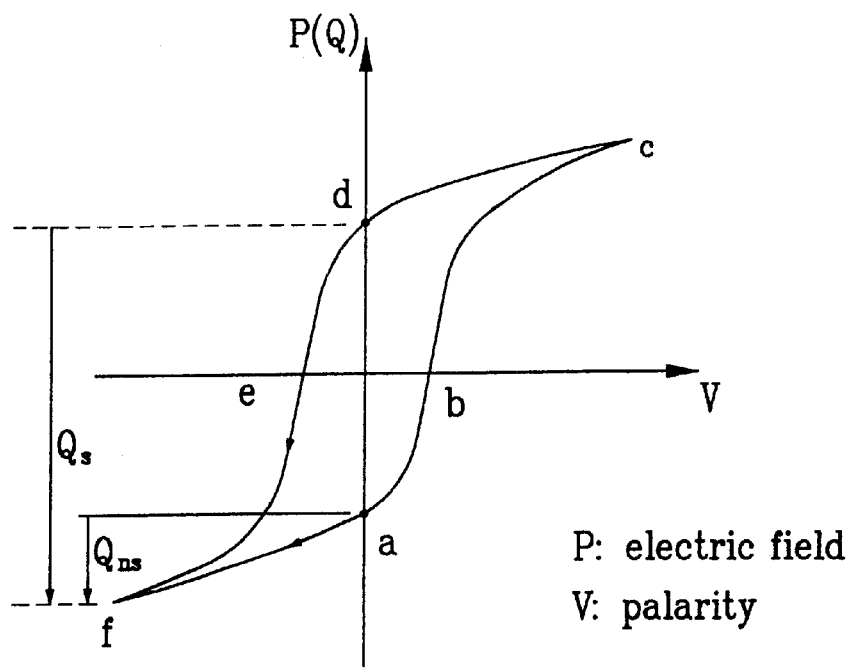
FIG. 1 illustrates a characteristic curve of a hysteresis loop of a general ferroelectric material.
Figure 2:
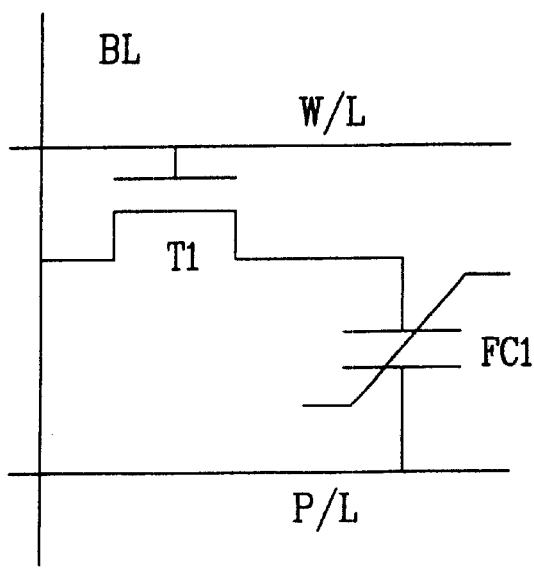
FIG. 2 illustrates a unit cell of the related art non-volatile ferroelectric memory.
Figure 3A:
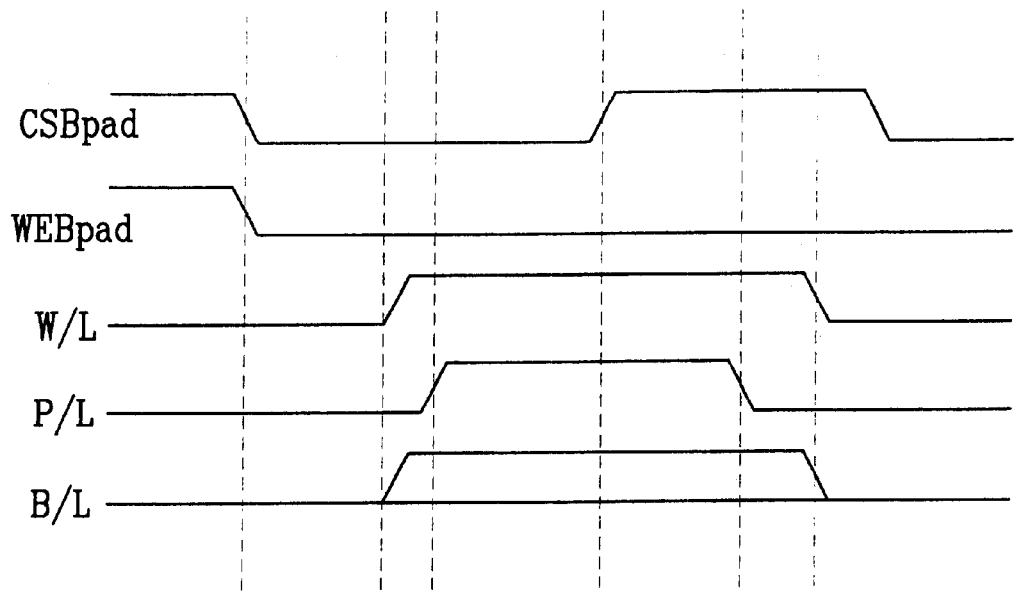
FIG. 3A illustrates a timing diagram of a write mode operation of the related art ferroelectric memory.
Figure 3B:
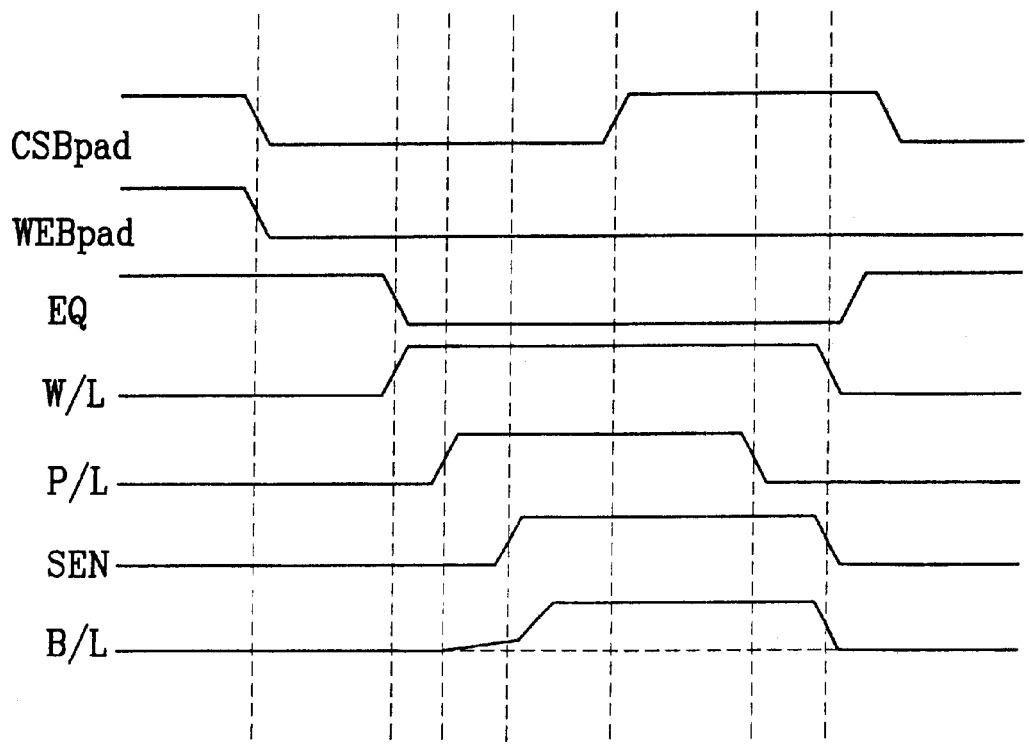
FIG. 3B illustrates a timing diagram of a read mode operation of the related art ferroelectric memory.

A system of unit cell is as shown in FIG. 2.

Figure 13:
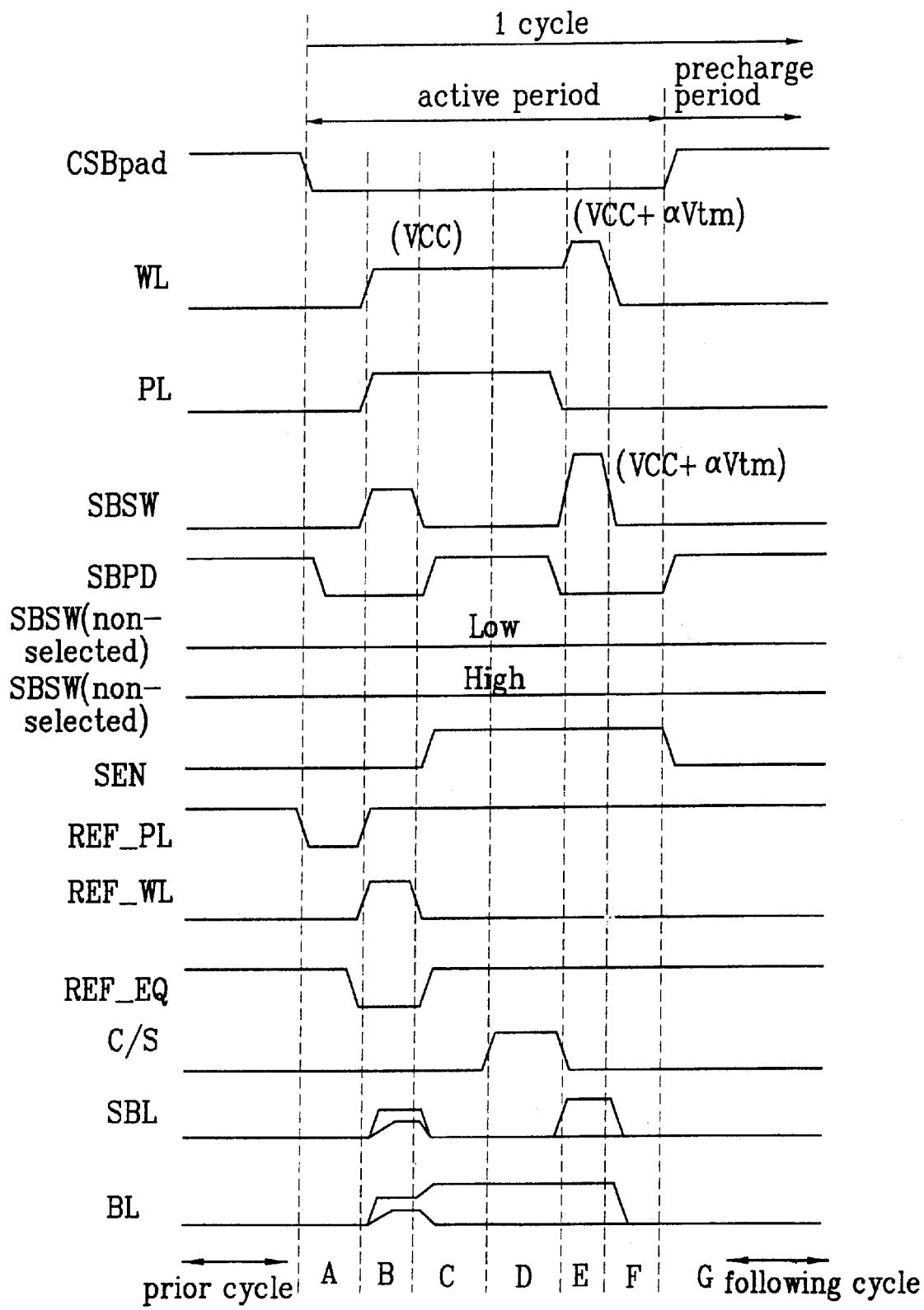

The operation of the ferroelectric cell array in accordance with the third preferred embodiment of the present invention will be explained. FIG. 13 illustrates an operation timing diagram of the ferroelectric cell array in accordance with the third preferred embodiment of the present invention. The timing operation of reference occurrence will be explained, at first.

During a prior cycle, a REF_PL, and a REF_EQ are at high, so as to leave the reference capacitor in a discharged state. In an 'A' period, for charging the reference capacitor, the REF_PL has a low pulse waveform, and the REF_EQ is still at high. In a 'B' period, for providing a reference level to the bitline BL, the charge stored in the reference ferroelectric capacitor in the 'A' period is discharged, again. To do this, the REF_EQ is disabled to a low pulse, the REF_WL is enabled to a high pulse, and the REF_PL is transited to high. According to this, the reference level is occurred at the bitline BL. The REF_EQ is transited to high again from the 'C' period and thereafter, for resetting the reference level to low, again.

The operation of the SWL cell array will be explained.

During the prior cycle, which is a period for pre-charging the bitline, the bitline BL, and the sub-bitline are in a state separated from each other as the sub-bitline enable switch signal SBSW is disabled to low, and the sub-bitline SBL is pre-charged to low as the sub-bitline pull down signal SBPD transits to high. The bitline BL is pre-charged to low, separately. In the 'A' period, the sub-bitline pull down signal SBPD is disabled to low, when an address is decoded. The wordline application signal WL is enabled to high in 'B', 'C', 'D', and 'E' periods, and, particularly, generates a voltage of (Vcc+aVtn) higher than external supply voltage in the 'E' period, where 'a' is a value greater than 1.5. The plateline application signal PL is enabled to high in 'B', 'C', and 'D' periods, disabled to low in rest of the periods. Therefore, both the wordline application signal WL, and the plateline application signal PL have a single pulse waveform. The sub-bitline enable switch signal SBSW has a double pulse waveform. In the 'B' period, the first high pulse is generated, for application of a cell data value to the bitline BL through the sub-bitline SBL, and disabled to low in 'C', and 'D' periods, to cut off a signal flow in the sub-bitline SBL, and in the bitline BL. Then, the SBSW signal is enabled to high in 'E', and 'F' periods again, to generate the second pulse (Vcc+aVtn) higher than Vcc, where 'a' has a value greater than 1.5. In the sub-bitline enable switch signal SBSW, the first pulse is an operation for loading the cell data on the bitline, and the second pulse is a step for restoring, or re-writing a logical '1', i.e., a high data, broken at the first pulse, or to be written, newly.

In order to re-write a logical '0', i.e., a low data, the sub-bitline pull down signal SBPD is used for re-writing a low data. That is, the data is written again not after operation of the sense amplifier is finished by using the low data on the bitline, but a low data is written on the cell by using the sub-bitline pull down signal SBPD. Therefore, in the data writing of the present invention, since writing of the low data can be made independent from the operation of the sense amplifier, the data writing can be made even if the sense amplifier is in operation, that can reduce a cell operation time period, and a cycle time period by eliminating a time period required for reinforcing the low data after data amplification by the sense amplifier. In more detail, the low data is reinforced by the sub-bitline pull down signal SBPD, and only the high data is written by the bitline BL, again. As a method for reinforcing the low data, the SBPD signal is set to high in 'C', and 'D' periods, to pull down the sub-bitline to low, forcibly. In this instance, as the WL, and PL signals are in an enabled state to high, the low data is written on the cell by the low level, again. In a non-selected sub-cell array block, the sub-bitline enable switch signal SBSW is disabled to low, and the sub-bitline pull down signal SBPD is at high to keep the sub-bitline at low. In the meantime, a sense amplifier enable signal SEN is enabled to high in 'C', 'D', and 'E' periods, for amplifying a bitline sensing data. The high data amplified thus is restored in the 'E' period, again. If a column selection signal C/S is enabled to high in 'D' period at a time point the amplification is finished, the amplified bitline data is loaded on a data bus outside of the cell array. On the other hand, in a write mode, since a data on an external data bus forcibly changes the data on the bitline, a new high data is written in 'E' period.

As has been explained, the ferroelectric memory, and the method for driving the same of the present invention have the following advantages.

The reduction of the bitline resistance and the capacitance made available by the present invention permits efficient fabrication of the cell array, and improvement of device characteristics, irrespective of a design rule.

The writing of a low data on a cell by using the sub-bitline pull down signal SBPD permits an independent writing of the low data, irrespective of the operation of the sense amplifier, that implies the data writing is made even during the sense amplifier is in operation, eliminating a time period required for reinforcing the low data continuous to the amplification by the sense amplifier, thereby reducing a cell operation time period, and a cycle time period.

It will be apparent to those skilled in the art that various modifications and variations can be made in the ferroelectric memory, and the method for driving the same of the present invention of the present invention without departing from the spirit or scope of the invention. Thus, it is intended that the present invention cover the modifications and variations of this invention provided they come within the scope of the appended claims and their equivalents.

What is claimed is:

1. A ferroelectric memory device, comprising:
   a cell array block having a plurality of sub-cell array blocks regularly arranged in columns and rows, each sub-cell array block includes a plurality of unit cells;
   a plurality of main bitlines disposed along a first direction corresponding to the sub-cell array blocks in column units;
   a plurality of sub-bitlines disposed along the first direction in a one-to-one correspondence to the sub-cell array blocks;
   a plurality of pairs of sub-bitline pull down signal application lines and sub-bitline enable switch signal application lines disposed along a second direction perpendicular to the first direction, each pair corresponding to the sub-cell array block for applying a sub-bitline enable switch signal and a sub-bitline pull down signal; and,
   a plurality of switching control blocks, each corresponding to the sub-cell array block for one of enabling the sub-bitlines selectively in response to the sub-bitline enable switch signal and pulling down the sub-bitlines in response to the sub-bitline pull down signal.

2. The device according to claim 1, wherein the plurality of switching control blocks each include first and second switching transistors interconnected in series, wherein the first switching transistor has a gate connected to the sub-bitline pull down signal application line, and one side electrode connected to a VSS terminal, the second switching transistor has a gate connected to the sub-bitline enable signal application line, and one side electrode connected to one of the main bitlines, and an output terminal the first, and second switching transistors are commonly connected to one of the sub-bitlines.

3. The device according to claim 1, wherein the plurality of unit cells each include:
   first and second split wordlines disposed along the second direction and spaced apart by a fixed distance;
   first and second bitlines disposed along the first direction;
   a first transistor having a gate connected to the first split wordline and a drain connected to the first bitline;
   a first ferroelectric capacitor FC1 connected between a source of the first transistor and the second split wordline;
   a second transistor having a gate connected to the second split wordline, and a drain connected to the second bitline; and
   a second ferroelectric capacitor connected between a source of the second transistor and the first split wordline.

4. The device according to claim 1, further comprising a split wordline driver disposed between column units and connected to adjacent sub-cell array blocks.

5. The device according to claim 4, wherein the plurality of unit cells each include:
   first and second split wordlines disposed along the second direction and spaced apart by a fixed distance;
   first and second bitlines disposed along the first direction;
   a first transistor disposed on a first side of the split wordline driver and having a gate connected to the first split wordline, and a drain connected to the first bitline;
   a first ferroelectric capacitor FC1 connected between a source of the first transistor and the second split wordline;
   a second transistor on a second side of the split wordline driver and having a gate connected to the second split wordline and a drain connected to the second bitline; and
   a second ferroelectric capacitor connected between a source of the second transistor and the first split wordline.

6. The device according to claim 1, wherein the plurality of unit cells each include:
   a bitline disposed along the first direction;
   a wordline disposed along the second direction;
   a plateline disposed along the second direction and spaced apart by a distance from the wordline;
   a transistor having a gate connected to the wordline, and a source connected to the bitline; and
   a ferroelectric capacitor having a first terminal connected to a drain of the transistor and a second terminal connected to the plateline.

7. The device according to claim 1, wherein the cell array block includes:
   a top cell array block;
   a bottom cell array block;
   a sense amplifier disposed the top cell array block and the bottom cell array block; and
   a plurality of reference cell array blocks, each disposed corresponding to the top cell array block and the bottom cell array block.

8. The device according to claim 7, wherein the plurality of reference cell array blocks each include:
   a plurality of bitlines disposed along the first direction;
   at least one reference wordline disposed along the second direction;
   a reference plateline disposed along the second direction and in parallel to the at least one reference wordline;
   a plurality of reference capacitors connected in parallel, each having a first electrode connected to the reference plateline, and a second electrode connected to a storage node of the reference cell;
   a level initializing portion of an NMOS transistor having a gate with a reference cell equalizing control signal applied thereto, a first side electrode connected to a ground terminal, and a second side electrode connected to the storage node; and
   a switching block having a plurality of NMOS transistors, each having a first side electrode connected to the bitline, a second side electrode connected to the storage node of the reference capacitor, and a gate connected to the reference wordline.

9. A ferroelectric memory device, comprising:
   a cell array block having a plurality of sub-cell array blocks, each with a plurality of unit cells regularly arranged in a column direction, and a row direction;
   a plurality of main bitlines disposed in a first direction;
   a plurality of sub-bitlines disposed in the first direction, each corresponding to one of the sub-cell array blocks;
   a plurality of pairs of split wordlines within each of the sub-cell array blocks disposed along a second direction perpendicular to the first direction;
   a plurality of sub-bitline pull down application lines and sub-bitline enable switch application lines disposed along the second direction, each corresponding to the sub-cell array block; and
   a plurality of switching control blocks, each disposed corresponding to one of the sub-bitline pull down signal application lines and one of the sub-bitline enable switch signal application lines, and a space between adjacent sub-cell arrays, for switching a sub-bitline pull down signal, and a sub-bitline enable switch signal.

10. The device according to claim 9, wherein the plurality of switching control blocks each include first and second switching transistors interconnected in series, wherein the first switching transistor has a gate connected to one of the sub-bitline pull down signal application lines, and a first side electrode connected to a VSS terminal, and the second switching transistor has a gate connected to one of the sub-bitline enable switch signal application lines, and a first side electrode connected to one of the main bitlines, and an output terminal commonly connecting the first and second switching transistors to the one of the sub-bitlines.

11. The device according to claim 9, wherein, as only one of the sub-bitline enable switch signals is enabled at one time point, each of the main bitlines are selectively connected to one of the plurality of sub-bitlines in one time of operation.

12. The device according to claim 9, wherein, when the sub-bitline pull down signal is enabled, a level of the selected sub-bitline is pulled down to Vss.

13. A ferroelectric memory device, comprising:
a cell array block having sub-cell array blocks each with a plurality of unit cells arranged in a column direction, and a row direction regularly;
a split wordline driver disposed at a center of the sub-cell array blocks divided in column units;
a plurality of main bitlines running in one direction;
a plurality of sub-bitlines each in correspondence to a sub-cell array block running in a direction the same with the main bitlines;
a plurality of pairs of split wordlines in each of the sub-cell array blocks running in a direction perpendicular both to the main bitlines and sub-bitlines;
a plurality of sub-bitline pull down signal application lines, and a plurality of sub-bitline enable switch application lines disposed along a direction the same with the split wordlines each in correspondence to the sub-cell array block; and
a plurality of switching control blocks each disposed in correspondence to the sub-bitline pull down application line, and the sub-bitline enable switch application line, and a space between adjacent sub-cell arrays, for switching a sub-bitline pull down signal and a sub-bitline enable switch signal.

14. The device according to claim 13, wherein each of the switching control blocks include first and second switching transistors connected in series, wherein the first switching transistor has a gate connected to the sub-bitline pull down signal application line, and one side electrode connected to a VSS terminal, and the second switching transistor has a gate connected to the sub-bitline enable switch signal application line, and one side electrode connected to one of the main bitlines, and an output terminal commonly connected the first and second switching transistors to the sub-bitline.

15. The device according to claim 13, wherein, as only one of the sub-bitline enable switch signals is enabled at one time point, each of the main bitlines are selectively connected to one of the plurality of sub-bitlines in one time of operation.

16. The device according to claim 13, wherein, when the sub-bitline pull down signal is enabled, a level of the selected sub-bitline is pulled down to Vss.

17. The device according to claim 13, wherein the split wordline driver is connected to the pairs of split wordlines of adjacent sub-cell array blocks.

18. A ferroelectric memory device, comprising:
a cell array block having sub-cell array blocks each with a plurality of unit cells arranged in a column direction, and a row direction regularly;
a plurality of main bitlines disposed along one direction;
a plurality of sub-bitlines each in correspondence to a sub-cell array block running in a direction the same with the main bitlines;
a plurality of pairs of wordlines/platelines in each of the sub-cell array blocks running in a direction perpendicular both to the main bitlines and the sub-bitlines;
a plurality of sub-bitline pull down signal application lines, and sub-bitline enable switch signal application lines running in a direction the same with pairs of the wordlines/platelines each disposed in correspondence to the sub-cell array block; and,
a plurality of switching control blocks each disposed in correspondence to the sub-bitline pull down signal application lines, and the sub-bitline enable switch signal application line, and a space between adjacent sub-cell arrays, for switching a sub-bitline pull down signal and a sub-bitline enable switch signal.

19. The device according to claim 18, wherein each of the switching control blocks include first and second switching transistors connected in series, wherein the first switching transistor has a gate connected to one of the sub-bitline pull down signal application lines, and one side electrode connected to a VSS terminal, and the second switching transistor has a gate connected to one of the sub-bitline enable switch signal application lines, and one side electrode connected to one of the main bitlines, and an output terminal commonly connecting the first and second switching transistors to one of the sub-bitlines.

20. The device according to claim 18, wherein, as only one of the sub-bitline enable switch signals is enabled at one time point, each of the main bitlines are selectively connected to one of the plurality of sub-bitlines in one time of operation.

21. The device according to claim 18, wherein, when the sub-bitline pull down signal is enabled, a level of the selected sub-bitline is pulled down to Vss.

22. A method for driving a ferroelectric memory of a split wordline structure for enabling, and pulling down a sub-bitline selected in response to a sub-bitline enable signal and a sub-bitline pull down signal, the method comprising:
(a) enabling a first split wordline application signal to high in 'B', 'C', 'D', and 'E' periods, and a second split wordline application signal to high in 'B', 'C', 'D', and 'F' periods, within a continuous enable cycle divided into 'A', 'B', 'C', 'D', 'E', and 'F' periods;
(b) enabling a sub-bitline enable switch signal to high in 'B' period at first for applying a cell data value to a bitline through a sub-bitline, disabling the sub-bitline enable switch signal to low in 'C', and 'D' periods for cutting off signal flows on the sub-bitline and the bitline, and enabling the sub-bitline enable switch signal to high again in 'E', and 'F' periods for the second time for restoring, or re-writing a logical '1', i.e., a high data, broken in 'B' period, or to be written newly; and,
(c) writing a logical '0', i.e., a low data, by using the sub-bitline pull down signal which is enabled to high only in 'C', and 'D' periods, regardless of operation of a sense amplifier.

23. The method according to claim 22, wherein data writing in response to the sub-bitline enable signal and the sub-bitline pull down signal is made in unit of a plurality of sub-cell array blocks in the cell array block, and, in a non-selected sub-cell array block, the sub-bitline enable switch signal is disabled to low, and the sub-bitline pull down signal is enabled to high, to keep the sub-bitline at low.

24. The method according to claim 22, wherein a sense amplifier enable signal for sensing data is enabled to high in 'C', 'D', 'E', and 'F' periods for amplifying a bitline sensing data, and an amplified high data is stored in 'E', and 'F' periods.

25. The method according to claim 22, wherein, during a cycle before 'A' period, a REF_EQ is in a high state for leaving a reference capacitor in a discharged state, and, in rest of the enable period, which is a bitline pre-charge period, the sub-bitline enable switch signal is disabled to low, to separate the bitline and the sub-bitline from each other, and the sub-bitline is pre-charged to low as the sub-bitline pull down signal becomes high.

26. The method according to claim 22, wherein the first split wordline application signal generates a voltage Vcc+ aVtn, where 'a' denotes a value greater than 1.5 higher than an external supply voltage Vcc in 'E' period, and the second split wordline application signal generates a voltage Vcc+aVtn higher than an external supply voltage Vcc in 'F' period.

27. The method according to claim 22, wherein the sub-bitline enable switch signal generates a voltage Vcc+aVtn, where 'a' denotes a value greater than 1.5 higher than Vcc in 'E', and 'F' periods.

28. The method according to claim 22, wherein, in an enable cycle in a reference cell block, a REF_PL generates a low pulse waveform, and the REF_EQ is kept to maintain a high state for charging a reference capacitor in 'A' period, for discharging the charge stored in the reference ferroelectric capacitor in 'A' period, the REF_EQ is disenabled to low pulse, a REF_WL is enabled to a high pulse, and the REF_PL is transited to high, for generating a reference level on the bitline BL in 'B' period, and the REF_EQ is transited to high in periods after 'C' period, for resetting the reference level to low again.

29. A method for driving a ferroelectric memory of a split wordline structure for enabling, and pulling down a sub-bitline selected in response to a sub-bitline enable signal and a sub-bitline pull down signal, the method comprising:

(a) enabling a wordline application signal to high in 'B', 'C', 'D', and 'E' periods, and a plateline application signal to high in 'B', 'C', and 'D' periods, within a continuous enable cycle divided into 'A', 'B', 'C', 'D', 'E', and 'F' periods;

(b) enabling a sub-bitline enable switch signal to high in 'B' period at first for applying a cell data value to a bitline through a sub-bitline, disabling the sub-bitline enable switch signal to low in 'C', and 'D' periods for cutting off signal flows on the sub-bitline, and the bitline, and enabling the sub-bitline enable switch signal to high again in 'E', and 'F' periods for the second time for restoring, or re-writing a logical '1', i.e., a high data, broken in 'B' period, or to be written newly; and, (c) writing a logical '0', i.e., a low data, by using the sub-bitline pull down signal which is enabled to high only in 'C', and 'D' periods, regardless of operation of a sense amplifier.

30. The method according to claim 29, wherein data writing in response to the sub-bitline enable signal and the sub-bitline pull down signal is made in unit of a plurality of sub-cell array blocks in the cell array block, and, in a non-selected sub-cell array block, the sub-bitline enable switch signal is disabled to low, and the sub-bitline pull down signal is enabled to high, to keep the sub-bitline at low.

31. The method according to claim 29, wherein, during a cycle before 'A' period, a REF_EQ is in a high state for leaving a reference capacitor in a discharged state, and, in rest of the enable period, which is a bitline pre-charge period, the sub-bitline enable switch signal is disabled to low, to separate the bitline and the sub-bitline from each other, and the sub-bitline is pre-charged to low as the sub-bitline pull down signal becomes high.

32. The method according to claim 29, wherein the wordline application signal and the signal generate voltages Vcc+aVtn, where 'a' denotes a value greater than 1.5 higher than an external supply voltage Vcc in 'E' period.

* * * * *